United States Patent [19]

Pawlowski et al.

[11] Patent Number: 5,424,166
[45] Date of Patent: Jun. 13, 1995

[54] NEGATIVE-WORKING RADIATION-SENSITIVE MIXTURE CONTAINING DIAZOMETHANE ACID GENERATOR AND A RADIATION-SENSITIVE RECORDING MATERIAL PRODUCED THERFROM

[75] Inventors: Georg Pawlowski, Wiesbaden; Ralph Dammel, Klein-Winterheim; Horst Roeschert, Biebelried; Walter Spiess, Dieburg; Winfried Meier, Frankfurt am Main, all of Germany

[73] Assignee: Hoechst Aktiengesellschaft, Frankfurt am Main, Germany

[21] Appl. No.: 194,307

[22] Filed: Feb. 4, 1994

Related U.S. Application Data

[63] Continuation of Ser. No. 661,328, Feb. 27, 1991, abandoned.

[30] Foreign Application Priority Data

Feb. 28, 1990 [DE] Germany .......................... 40 06 190.6

[51] Int. Cl.$^6$ .............................................. G03F 7/021
[52] U.S. Cl. .................................. 430/157; 430/170; 430/176; 430/281
[58] Field of Search ................ 430/157, 170, 176, 281

[56] References Cited

U.S. PATENT DOCUMENTS

| | | |
|---|---|---|
| 3,515,552 | 6/1970 | Smith . |
| 3,536,489 | 10/1970 | Smith . |
| 3,615,455 | 10/1971 | Laridon et al. . |
| 3,615,630 | 10/1971 | Dietrich . |
| 3,682,642 | 8/1972 | Laridon et al. ................ 430/176 |
| 3,686,084 | 8/1972 | Rosenkranz et al. . |
| 3,692,560 | 9/1972 | Rosenkranz et al. . |
| 3,779,778 | 12/1973 | Smith et al. . |
| 3,912,606 | 10/1975 | Pacifici et al. . |
| 4,189,323 | 2/1980 | Buhr .................................. 430/281 |
| 4,212,970 | 7/1980 | Iwasaki .............................. 542/455 |
| 4,232,106 | 11/1980 | Iwasaki et al. .................... 430/170 |
| 4,279,982 | 7/1981 | Iwasaki et al. .................... 430/170 |
| 4,343,885 | 8/1982 | Reardon, Jr. ....................... 430/177 |
| 4,371,606 | 2/1983 | Dönges .............................. 430/281 |
| 4,371,607 | 2/1983 | Dönges .............................. 430/281 |
| 4,619,998 | 10/1986 | Buhr ................................ 544/193.1 |
| 4,696,888 | 9/1987 | Buhr .................................. 430/270 |
| 4,840,867 | 6/1989 | Elsaesser et al. .................. 430/156 |
| 4,996,301 | 2/1991 | Wilharm et al. ................... 534/556 |

FOREIGN PATENT DOCUMENTS

| | | |
|---|---|---|
| 0 164 248 | 12/1985 | European Pat. Off. . |
| 0 232 972 | 8/1987 | European Pat. Off. . |
| 39 30 087 | 3/1991 | Germany . |
| 39 30 086 | 3/1991 | Germany . |
| 84/7165 | 4/1985 | South Africa . |
| 1163324 | 9/1969 | United Kingdom . |
| 1231789 | 5/1971 | United Kingdom . |
| 1234648 | 6/1971 | United Kingdom . |
| 1381471 | 1/1975 | United Kingdom . |
| 1381472 | 1/1975 | United Kingdom . |
| 1388492 | 3/1975 | United Kingdom . |

OTHER PUBLICATIONS

Willson, "Organic Resist Materials-Theory and Chemistry" (Introduction to Microlithography, Theory, Materials, and Processing, L. F. Thompson, C. G. Willson, M. J. Bowden, ACS Symp., Ser., 219, 87 (1983), American Chemical Society, Washington, pp. 88-159.

Crivello, "Possibilities for Photoimaging Using Onium Salts", Polymer Engineering and Science, vol. 23, No. 17, Mid-Dec., 1983, pp. 953-956.

Houlihan et al., "An evaluation of nitrobenzyl ester chemistry for chemical amplification resists", SPIE, vol. 920, Advances in Resist Technology and Processing V, (1988), pp. 67-74.

*Primary Examiner*—Charles L. Bowers, Jr.
*Assistant Examiner*—Christopher G. Young
*Attorney, Agent, or Firm*—Foley & Lardner

[57] ABSTRACT

A negative-working radiation-sensitive mixture which comprises a) a compound, which forms a strong acid on irradiation, of the general formula $$R^1-\underset{\underset{N_2}{\|}}{C}-SO_2-R^2 \qquad I$$

in which (Abstract continued on next page.)

$R^1$ is a radical $R^2$—$SO_2$— or $R^3$—$C(O)$— and $R^2$ and $R^3$ independently of one another are an optionally substituted alkyl, cycloalkyl, aryl or heteroaryl radical, b) a compound containing at least two reactive groups which can be crosslinked by an acid and c) a water-insoluble binder which is soluble or at least swellable in aqueous-alkaline solutions, is described.

The radiation-sensitive mixture according to the invention is distinguished by a high sensitivity over a wide spectral range. It likewise exhibits a high heat stability and forms no corrosive photolysis products on exposure to light.

26 Claims, No Drawings

NEGATIVE-WORKING RADIATION-SENSITIVE MIXTURE CONTAINING DIAZOMETHANE ACID GENERATOR AND A RADIATION-SENSITIVE RECORDING MATERIAL PRODUCED THERFROM

This application is a continuation of application Ser. No. 07/661,328, filed Feb. 27, 1991, now abandoned.

BACKGROUND OF THE INVENTION

The invention relates to a negative-working radiation-sensitive mixture which contains as essential constituents a) a compound which forms a strong acid when irradiated, b) a compound having at least two reactive groups which can be crosslinked by an acid and c) a water-insoluble binder which is soluble or at least swellable in aqueous-alkaline solutions.

The invention furthermore relates to a radiation-sensitive recording material produced therefrom, which is suitable for the production of photoresists, electronic components or printing plates or for chemical milling.

In UV lithography, the resolution limit is determined by the wavelength of the radiation used. The constant reduction in structural dimensions, for example in chip production, therefore requires different lithography techniques in the submicron range. High-energy UV light or electron beams and X-rays, for example, are used because of their short wavelength. However, the change in the lithography techniques manifests itself in a change in the requirements of the radiation-sensitive mixture. A summary of these requirements is given, for example, in the paper by C. G. Willson "Organic Resist Materials-Theory and Chemistry" (Introduction to Microlithography, Theory, Materials, and Processing, Publisher L. F. Thompson, C. G. Willson, M. J. Bowden, ACS Symp. Ser., 219, 87 (1983), American Chemical Society, Washington). There is therefore an increased demand for radiation-sensitive mixtures which are preferably sensitive within a wide spectral range and accordingly can be used in conventional UV lithography or, without losses in sensitivity, in the advanced technologies, such as, for example, the mid- or deep-UV, electron beam or X-ray lithography.

Negative-working radiation-sensitive mixtures which contain bisazides as crosslinking agents and isoprene derivatives as binders are known and have been used in the past for the preparation of photoresists for printing plates, printed circuits and integrated circuits. However, their use in microlithography in particular is limited by various technical disadvantages: it is difficult to produce faultless high-quality layers without defects (pin-holes); the heat stability of such mixtures is inadequate, so that distortions in reproduction may occur during processing due to thermal flow of the mixtures, and finally their resolving power is limited to structures greater than 2 μm, since they tend to undergo swelling to an undesirably high degree, even in the hardened regions, during the necessary development with organic solvents, which in turn manifests itself in distortions in the structure or inhomogeneous development processes and therefore inadequate reproduction of the precision of the patterns of a mask.

For the above-mentioned reasons, other negative-working radiation-sensitive mixtures have been proposed, which can be irradiated with radiation of shorter wavelength, for example high-energy UV, electron or X-ray radiation, to allow generation of structures finer than 2 μm.

Such a material consists, for example, of a copolymer or mixture of glycidyl methacrylate and 2,3-dichloropropyl methacrylate (DCOPA). In this material also, the glass transition temperature is inadequate for many applications but in particular its low resistance to plasma etching is at fault. This material must moreover also be processed with developers which contain organic solvents and are not very environment-friendly. The low resistance to plasma etching described above is a problem which also applies to other known negative-working photoresists based on aliphatics.

EP-A 0,164,248 has thus proposed an acid-hardenable mixture which can be developed under aqueous-alkaline conditions, has an improved resistance to plasma etching due to the use of aromatics and is sensitive towards near UV light (350–450 nm). Compounds which have been proposed as being suitable for generating acid in this mixture are, in particular, sulfonic acid ester derivatives of diazonaphthoquinone, which form weakly acid carboxylic acids when exposed to light and therefore have to be used in comparatively high concentrations. However, because of the weak absorptions of the photolytic acid donor and its inadequate bleaching properties, and also their low sensitivity in the deep UV, such mixtures are unsuitable for uses in this range and also for electron and X-ray radiation.

U.S. Pat. No. 3,692,560 describes the combination of an acid-hardenable mixture based on an acid-crosslinkable melamine derivative, a novolak and chlorinated benzophenones as photolytic acid donors. These mixtures also do not have an adequate sensitivity in the deep UV range. The photolytic formation of hydrogen halide acids as the crosslinking catalyst is moreover undesirable, since these typically can undergo reactions with the doping agents during the subsequent doping processes. The hydrogen halide acids which remain in the hardened resist are furthermore highly corrosive and may lead to destruction of the material which can be imaged and the production equipment.

The same applies to the derivatives, mentioned in EP 0,232,972, of the acid generator DDT claimed in that patent, which is highly toxic and for this reason alone does not seem to be appropriate in practice. However, a considerable sensitivity in the deep UV range (200–300 nm) can nevertheless be achieved with such compounds.

Further compounds (a) which can be characterized as photolytic acid donors and have hitherto been recommended are, in particular, onium salts, such as diazonium, phosphonium, sulfonium and iodonium salts, of non-nucleophilic acids, for example of $HSbF_6$, $HAsF_6$ or $HPF_6$ (J. V. Crivello, Polym. Eng. Sci., 23, 953 (1983)), halogen compounds (EP-A 0,232,972, DE-A 1,572,089 (=GB-A 1,163,324), DE-A 1,817,540 (=U.S. Pat. No. 3,615,455), DE-A 1,949,010 (=U.S. Pat. No. 3,686,084), DE-A 2,317,846 (=GB-A 1,381,471 and 1,381,472) and U.S. Pat. No. 3,912,606), in particular trichloromethyltriazine derivatives (DE-A 1,298,414 (=GB-A 1,234,648), DE-A 2,243,621 (=GB-A 1,388,492), DE-A 2,306,248, DE-A 2,718,259 (=U.S. Pat. No. 4,189,323), DE-A 3,333,450 (=S.A. 84/7165) DE-A 3,337,024 (=U.S. Pat. Nos. 4,619,998 and 4,696,888), and also U.S. Pat. Nos. 3,515,552, 3,536,489 and 3,615,630), or trichloromethyl-oxadiazole derivatives (DE-A 2,851,472 (=U.S. Pat. Nos. 4,212,970 and 4,232,106), DE-A 2,949,396 (=U.S. Pat. No. 4,279,982), DE-A 3,021,590 (=U.S. Pat. No. 4,371,607) and DE-A 3,021,599 (=U.S. Pat. No. 4,371,606) and DE-A 3,333,450), o-quinonediazide sulfochlorides or organometallic-organohalogen combinations.

These compounds have been recommended in some cases in negative-working and in some cases in positive-working radiation-sensitive materials. However, the use of such photolytic acid donors involves certain disadvantages which drastically limit their possible uses in various fields of application. Thus, for example, many of the onium salts are toxic. Their solubility is inadequate in many solvents, which results in the choice of the coating solvents being limited. Undesirable foreign atoms are moreover in some cases introduced when onium salts are used, and these can lead to disturbances in the process, especially in microlithography. They furthermore also form highly corrosive Bronstedt acids during photolysis, and these render the use of radiation-sensitive mixtures containing them on sensitive substrates unsatisfactory. As already mentioned earlier, the halogen compounds and the quinone-diazide sulfochlorides also form highly corrosive hydrogen halide acids. Such compounds furthermore have only a limited stability on certain substrates, which in accordance with the doctrine of DE-A 3,621,376 (=U.S. Pat. No. 4,840,867) was improved in the past by inserting an intermediate layer between the substrate and the radiation-sensitive layer containing compounds of type (a), although this leads to an undesirable increase in defects and a reduction in the reproducibility of the process.

Recent works by F. M. Houlihan et al., SPIE 920, 67 (1988) have shown with the aid of positive-working systems that, in addition to the above-mentioned acid donors, nitrobenzyl tosylates which form sulfonic acids of little mobility when exposed to light can also be used in certain resist formulations which are unstable to acid. It can be deduced from these results that such compounds can also be used for photohardenable systems. However, the sensitivities achieved with these and the heat stability of the photoresists have proved to be inadequate.

In spite of the numerous inventions and improvements in this field, no material is currently known which suggests heat-stable radiation-sensitive negative-working mixtures which can be developed under aqueous-alkaline conditions and in which a high sensitivity in the deep UV range, by means of low-corroding photolytically generated acids, is linked with a high resolution.

Because of the disadvantages described, there is therefore a need for further photolytically acting acid donors which, as constituents of radiation-sensitive mixtures, do not have the disadvantages described above and thus have a sufficient reactivity and acid strength to cause compounds of type (b) to crosslink even during short exposure times.

SUMMARY OF THE INVENTION

Accordingly, it is an object of the present invention to provide a radiation-sensitive mixture based on acid-forming compounds in combination with acid-crosslinkable compounds, in which the compound (a) which forms an acid photolytically is as stable as possible on all known substrates and generates a non-corrosive acid as the photoproduct.

Another object of the present invention is to provide an improved radiation-sensitive recording material.

A further object of the present invention is to provide a process for preparing the foregoing radiation-sensitive recording material.

In accomplishing the foregoing objectives, there has been provided, in accordance with one aspect of the present invention, a negative-working radiation-sensitive mixture comprising
 (a) a compound which forms an acid under irradiation,
 (b) a compound containing at least two reactive groups which can be crosslinked by an acid, and
 (c) a water-insoluble binder which is soluble or at least swellable in aqueous-alkaline solutions,
wherein the compound (a) is a compound of the formula I

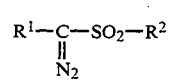

in which
 $R^1$ is one of the radicals $R^2-SO_2-$ or $R^3-C(O)-$ and
 $R^2$ and $R^3$ are independently an optionally substituted alkyl, cycloalkyl, aryl or heteroaryl radical.

In accordance with another aspect of the present invention there is provided a negative-working radiation-sensitive recording material comprising a substrate and a radiation-sensitive layer, wherein the layer comprises a negative-working radiation-sensitive mixture as defined above.

In accordance with a further aspect of the present invention there is provided a process for the production of a radiation-sensitive recording material, which comprises applying to a substrate a solution of a solvent and a negative-working radiation-sensitive recording mixture as defined above to a substrate, and removing the solvent by evaporation.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The radiation-sensitive mixture according to the invention is distinguished by a high sensitivity over a wide spectral range. It exhibits a high heat stability and provides the possibility of structurally accurate reproduction of even the finest structures of a master. No corrosive photolysis products are formed by the exposure, so that the mixture can also be used on sensitive substrate materials.

Preferred radicals are $(C_1-C_{16})$alkyl, in particular $(C_1-C_6)$ alkyl, $(C_5-C_{12})$ alkyl, $(C_5-C_{12})$cycloalkyl, in particular $C_6$-cycloalkyl, $(C_6-C_{12})$aryl and a mono- or dinuclear heteroalkyl radical having five or six members in each case and containing O, S or N as hetero atoms.

These compounds are accordingly to be assigned to the groups comprising α,α-bis-sulfonyldiazomethanes $(R^1=R^2-SO_2)$ or α,α-carbonylsulfonyldiazomethanes ($R^1 = R^3$—C(O)). The use of these compounds in highly sensitive positive-working mixtures is described in German Patent Applications 39 30 086.2 (corresponding to U.S. Ser. No. 07/578,465) and 39 30 087.2 (corresponding to U.S. Ser. No. 07/578,778), which have not been previously published.

Compounds of the general formula I in which $R^2$ and $R^3$ each represent an optionally substituted alkyl or cycloalkyl radical independent of one another, an optionally substituted aryl radical or an optionally substituted heteroaryl radical can be used for the preparation of the radiation-sensitive mixture.

Examples of suitable substituents $R^2$ and $R^3$ in compounds of the general formula I are: methyl, ethyl, propyl, butyl, pentyl, hexyl, cyclohexyl, nonyl, decyl or undecyl groups, as well as position isomers thereof, and benzene and naphthalene, as well as derivatives thereof in which one or more hydrogen atoms are substituted, for example, by alkyl, alkoxy, alkoxyalkyl, aryl, aryloxy, arylalkoxy, halogen, cyano, nitro, carbonyl or carboxyl radicals or similar radicals.

Particularly preferred substituents are alkyl, alkoxy, alkoxyalkyl, halogens, in particular fluorine, chlorine or bromine, and cyano, alkyl and alkoxyalkyl radicals containing, in particular, 1 to 4 carbon atoms. If the aromatic radicals are polysubstituted, possible substituents are mainly ($C_1$–$C_4$)alkyl and the halogens chlorine and bromine mentioned. In this case the radicals are then in particular disubstituted radicals R. However, if fluorine is present as a substituent of the radical R, more than two fluorine atoms can also occur as substituents of the radical R; however, the latter case is not preferred. If R is heteroaryl, this mainly contains one hetero atom, even if R is a dinuclear radical. If N is chosen as the hetero atom, this can occur a maximum of twice per nucleus.

Preferred compounds of the general formula I are those in which $R^2$ or $R^3$ independently of one another is an alkyl radical having 1 to 6 carbon atoms or an optionally substituted aryl radical, and at least one of the radicals $R^2$ or $R^3$ is an optionally substituted aryl radical, mono- or dinuclear ($C_6$–$C_{12}$)aryl radicals being particularly preferred.

Compounds of the general formula I in which $R^2$ and $R^3$ are at least one optionally substituted aryl radical, independently of one another, are particularly preferred.

Examples which may be mentioned of preferred compounds are:
methylsulfonyl-benzoyl-diazomethane,
ethylsulfonyl-benzoyl-diazomethane,
methylsulfonyl-4-bromo-benzoyl-diazomethane,
ethylsulfonyl-4-bromo-benzoyl-diazomethane,
phenylsulfonyl-benzoyl-diazomethane,
phenylsulfonyl-m-toluoyl-diazomethane,
phenylsulfonyl-p-toluoyl-diazomethane,
phenylsulfonyl-3-methoxy-benzoyl-diazomethane,
phenylsulfonyl-4-methoxy-benzoyl-diazomethane,
phenylsulfonyl-3-chloro-benzoyl-diazomethane,
phenylsulfonyl-4-chloro-benzoyl-diazomethane,
phenylsulfonyl-2-bromo-benzoyl-diazomethane,
phenylsulfonyl-3-bromo-benzoyl-diazomethane,
phenylsulfonyl-4-bromo-benzoyl-diazomethane,
phenylsulfonyl-4-cyano-benzoyl-diazomethane,
phenylsulfonyl-1-naphthoyl-diazomethane,
phenylsulfonyl-2-naphthoyl-diazomethane,
p-tolylsulfonyl-benzoyl-diazomethane,
p-tolylsulfonyl-m-toluoyl-diazomethane,
p-tolylsulfonyl-p-toluoyl-diazomethane,
p-tolylsulfonyl-3-methoxy-benzoyl-diazomethane,
p-tolylsulfonyl-4-methoxy-benzoyl-diazomethane,
p-tolylsulfonyl-3-chloro-benzoyl-diazomethane,
p-tolylsulfonyl-4-chloro-benzoyl-diazomethane,
p-tolylsulfonyl-2-bromo-benzoyl-diazomethane,
p-tolylsulfonyl-3-bromo-benzoyl-diazomethane,
p-tolylsulfonyl-4-bromo-benzoyl-diazomethane,
p-tolylsulfonyl-4-cyano-benzoyl-diazomethane,
p-tolylsulfonyl-1-naphthoyl-diazomethane,
p-tolylsulfonyl-2-naphthoyl-diazomethane,
bis-(methylsulfonyl)-diazomethane,
bis-(ethylsulfonyl)-diazomethane,
bis-(propylsulfonyl)-diazomethane,
bis-(1-methylpropylsulfonyl)-diazomethane,
bis-(2-methylpropylsulfonyl)-diazomethane,
bis-(butylsulfonyl)-diazomethane,
bis-(1-methylbutylsulfonyl)-diazomethane,
bis-(2-methylbutylsulfonyl)-diazomethane,
bis-(3-methylbutylsulfonyl)-diazomethane,
bis-(allylsulfonyl)-diazomethane,
bis-(heptylsulfonyl)-diazomethane,
bis-(octylsulfonyl)-diazomethane,
bis-(nonylsulfonyl)-diazomethane,
bis-(decylsulfonyl)-diazomethane,
bis-(dodecylsulfonyl)-diazomethane,
bis-(trifluoromethylsulfonyl)-diazomethane,
bis-(hexadecylsulfonyl)-diazomethane,
bis-(cyclohexylsulfonyl)-diazomethane,
bis-(2-oxapentylsulfonyl)-diazomethane,
bis-(benzylsulfonyl)-diazomethane,
bis-(2-chlorobenzylsulfonyl)-diazomethane,
bis-(4-chlorobenzylsulfonyl)-diazomethane,
bis-(4-methoxysulfonyl)-diazomethane,
bis-(phenylsulfonyl)-diazomethane,
bis-2-methylphenylsulfonyl)-diazomethane,
bis-3-methylphenylsulfonyl)-diazomethane,
bis-4-methylphenylsulfonyl)-diazomethane,
bis-4-ethylphenylsulfonyl)-diazomethane,
bis-2,4-dimethylphenylsulfonyl)-diazomethane,
bis-2,5-dimethylphenylsulfonyl)-diazomethane,
bis-3,4-dimethylphenylsulfonyl)-diazomethane,
bis-4-t-butylphenylsulfonyl)-diazomethane,
bis-2-methoxyphenylsulfonyl)-diazomethane,
bis-3-methoxyphenylsulfonyl)-diazomethane,
bis-4-methoxyphenylsulfonyl)-diazomethane,
bis-2-chlorophenylsulfonyl)-diazomethane,
bis-3-chlorophenylsulfonyl)-diazomethane,
bis-(4-chlorophenylsulfonyl)-diazomethane,
bis-(2,5-dichlorophenylsulfonyl)-diazomethane,
bis-(2,6-dichlorophenylsulfonyl)-diazomethane,
bis-(3,4-dichlorophenylsulfonyl)-diazomethane,
bis-(2-bromophenylsulfonyl)-diazomethane,
bis-(3-bromophenylsulfonyl)-diazomethane,
bis-(4-bromophenylsulfonyl)-diazomethane,
bis-(4-fluorophenylsulfonyl)-diazomethane,
bis-(2,4-difluorophenylsulfonyl)-diazomethane,
bis-(pentafluorophenylsulfonyl)-diazomethane,
bis-(4-nitrophenylsulfonyl)-diazomethane,
bis-(4-acetamidophenylsulfonyl)-diazomethane,
bis-(4-acetoxyphenylsulfonyl)-diazomethane,
bis-(2-naphthalenesulfonyl)-diazomethane,
bis-(furfurylsulfonyl)-diazomethane,
bis-(imidazolylsulfonyl)-diazomethane,
bis-(2-methylimidazolylsulfonyl)-diazomethane,
bis-(benzimidazole-2-sulfonyl)-diazomethane,
bis-(benzoxazole-2-sulfonyl)-diazomethane,
bis-(benzothiazole-2-phenylsulfonyl)-diazomethane.

These compounds are particularly suitable because on the one hand they have a high photolysis reactivity but on the other hand they have an adequate heat stability.

The above-mentioned compounds have high absorption maxima in a range between 220 and 270 nm and are therefore particularly suitable for irradiation with high-energy UV radiation. However, they moreover also have relatively low absorptions in the range between 350 and 450 nm and are therefore at the same time suitable for exposure to near UV light.

Of the above-mentioned compounds of the general formula I in which $R^2$ and $R^3$ are a substituted aryl radical, the following compounds are particularly preferred:
phenylsulfonyl-benzoyl-diazomethane,
phenylsulfonyl-p-toluoyl-diazomethane,
phenylsulfonyl-4-methoxy-benzoyl-diazomethane,
phenylsulfonyl-3-chloro-benzoyl-diazomethane,
phenylsulfonyl-4-chloro-benzoyl-diazomethane,
phenylsulfonyl-3-bromo-benzoyl-diazomethane,
phenylsulfonyl-4-bromo-benzoyl-diazomethane,
phenylsulfonyl-4-cyano-benzoyl-diazomethane,
phenylsulfonyl-1-naphthoyl-diazomethane,
phenylsulfonyl-2-naphthoyl-diazomethane,
p-tolylsulfonyl-benzoyl-diazomethane,
p-tolylsulfonyl-p-toluoyl-diazomethane,
p-tolylsulfonyl-4-methoxy-benzoyl-diazomethane,
p-tolylsulfonyl-3-chloro-benzoyl-diazomethane,
p-tolylsulfonyl-4-chloro-benzoyl-diazomethane,
p-tolylsulfonyl-3-bromo-benzoyl-diazomethane,
p-tolylsulfonyl-4-bromo-benzoyl-diazomethane,
p-tolylsulfonyl-4-cyano-benzoyl-diazomethane,
p-tolylsulfonyl-1-naphthoyl-diazomethane,
p-tolylsulfonyl-2-naphthoyl-diazomethane,
bis-(2-methylphenylsulfonyl)-diazomethane,
bis-(3-methylphenylsulfonyl)-diazomethane,
bis-(4-methylphenylsulfonyl)-diazomethane,
bis-(4-ethylphenylsulfonyl)-diazomethane,
bis-(2,4-dimethylphenylsulfonyl)-diazomethane,
bis-(3,4-dimethylphenylsulfonyl)-diazomethane,
bis-(4-t-butylphenylsulfonyl)-diazomethane,
bis-(4-methoxyphenylsulfonyl)-diazomethane,
bis-(2-chlorophenylsulfonyl)-diazomethane,
bis-(3-chlorophenylsulfonyl)-diazomethane,
bis-(4-chlorophenylsulfonyl)-diazomethane,
bis-(2,5-dichlorophenylsulfonyl)-diazomethane,
bis-(2,6-dichlorophenylsulfonyl)-diazomethane,
bis-(3,4-dichlorophenylsulfonyl)-diazomethane,
bis-(3-bromophenylsulfonyl)-diazomethane,
bis-(4-bromophenylsulfonyl)-diazomethane,
bis-(4-fluorophenylsulfonyl)-diazomethane,
bis-(2,4-difluorophenylsulfonyl)-diazomethane,
bis-(4-nitrophenylsulfonyl)-diazomethane,
bis-(4-acetoxyphenylsulfonyl)-diazomethane.

The preparation of the compounds employed according to the invention is known per se. α-Carbonyl-α-sulfonyl-diazomethane derivatives can be synthesized, for example, in accordance with the instructions of W. Illger, A. Liedgehegener and M. Regitz, Ann., 760, 1 (1972). A summary of their preparation and properties has been given by M. Regitz and G. Maas in the book "Diazo Compounds, Properties and Synthesis", Academic Press, Orlando, 1986.

The preparation of the α,α-bis-sulfonyldiazomethane derivatives employed according to the invention is likewise known per se. Their preparation has been described, for example, by F. Klages et al., Chem. Ber., 97, 735 (1964).

The use of the compounds of the general formula I as solution inhibitors for positive-working materials, in particular for printing plates, has moreover been investigated in the past by A. Poot et al., J. Photogr. Sci., 19, 88 (1971); however, their practical suitability in photoresist formulations has been excluded because of an inadequate photosensitivity.

It was therefore particularly surprising that, during their photolysis, the compounds of the general formula I employed according to the invention form adequate amounts of sufficiently strong acids which allow the preparation of the highly sensitive negative-working radiation-sensitive mixture according to the invention. Although there are no accurate interpretations of the extent and nature of the acids formed, it is to be assumed that sulfonic or sulfinic acids are formed in particular by the photolysis.

Because of their high molecular weight, these acids exhibit a much lower tendency to diffuse or mobility in the radiation-sensitive mixture according to the invention than the photolytically generated acids previously used, such as, for example, hydrochloric acid, so that on the one hand it was surprising that it was possible to achieve an image differentiation which meets the highest requirements, but on the other hand it was all the more surprising that the contrast and therefore the hardening power of the radiation-sensitive mixture was increased further at a comparable sensitivity. It was moreover surprising that the compounds of the general formula I can also be activated by high-energy shortwave radiation, and thus, for example, it is possible to produce a highly sensitive photoresist for high-energy UV2 radiation (248 nm). In particular, however, it was unexpected that an adequate spectral responsiveness is even still present in the range of classical optical lithography (436 nm).

Actinic radiation in this connection is to be understood as any radiation of an energy which corresponds at least to that of short-wavelength visible light. Particularly suitable radiation here is UV radiation in the range from 190 to 450 nm, preferably 200 to 400 nm and particularly preferably 200 to 300 nm, and also electron and X-ray radiation.

The photolytic acid donors contained in the radiation sensitive mixture according to the invention can be used by themselves or in combination with other acid donors of the class mentioned. However, combinations with other photolytic acid donors are also possible, such as, for example, with onium salts, such as diazonium, phosphonium, sulfonium and iodonium salts, of non-nucleophilic acids, for example of $HSbF_6$, $HAsF_6$ or $HPF_6$ (J. V. Crivello, Polym. Eng. Sci., 23, 953 (1983), halogen compounds (EP-A 0,232,972, DE-A 1,572,089, DE-A 1,817,540, DE-A 1,949,010, U.S. Pat. No. 3,912,606 and DE-A 2,317,486), in particular trichloromethyltriazine derivatives (U.S. Pat. No. 3,515,552, U.S. Pat. No. 3,536,489, U.S. Pat. No. 3,615,630, U.S. Pat. No. 3,779,778, DE-A 2,718,259, DE-A 3,337,024, DE-A 3,333,450, DE-A 2,306,248, DE-A 2,243,621 and DE-A 1,298,414) or trichloromethyloxadiazole derivatives (DE-A 3,021,590, DE-A 3,021,599, DE-A 2,851,472, DE-A 2,949,396, DE-A 3,333,450 or EP-A 135,348) or o-quinone-diazide sulfochlorides or organometallic-organohalogen combinations. Overall, however, such combinations are not preferred, since the above-mentioned disadvantages occur again in such radiation-sensitive mixtures.

The content of acid donors of the general formula I in the mixture according to the invention is in general between about 0.5 and 25% by weight, preferably about 1 to 10% by weight, in each case based on the total weight of the layer.

Possible substances as the acid-crosslinkable material b) are in principle the resols disclosed in British Patent 2,082,339, alkoxymethyl- or glycidyl-substituted aromatics (EP-A 0,212,482) or monomeric and oligomeric melamine- or urea-formaldehyde condensates (EP-A 0,133,216, DE-A 3,634,371 or DE-A 3,711,264). Examples of the first type are, in particular, the commercially available resol products Bakelite R 5363, Bakelite R 17620, Bakelite R 10282 and Kelrez 40-152 (Bakelite and Kelrez are tradenames). Overall, however, such resol derivatives are not preferred since they exhibit relatively high absorptions in the deep UV range and therefore lead to an impairment in image reproduction.

More suitable crosslinking agents are those known from EP-A 0,212,482, of the general formula II

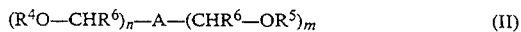

(II)

in which

A is —B— or —B—Y—B—,

B is an optionally substituted mononuclear aromatic hydrocarbon or a heterocyclic aromatic compound containing oxygen or sulfur, Y is a single bond, $(C_1-C_4)$alkylene or $(C_1-C_4)$-alkylenedioxy, the chains of which can be interrupted by oxygen atoms, —O—, —S—, —SO$_2$—, —CO—, —CO$_2$—, —O—CO$_2$—, —CONH— or phenylenedioxy, $R^4$ and $R^5$ are hydrogen, $(C_1-C_6)$alkyl, $C_5$- or $C_6$-cycloalkyl, optionally substituted $(C_6-C_{12})$aryl, $(C_1-C_{12})$-aralkyl or acyl, $R^6$ is hydrogen, $(C_1-C_4)$alkyl or optionally substituted phenyl, n is an integer from 1 to 3 and m is an integer from 0 to 3, n+m being at least 2.

Compounds which can typically be used are accordingly aromatics and heterocyclic compounds polysubstituted by hydroxymethyl, acetoxymethyl and methoxymethyl.

Other preferred crosslinking agents are melamine-/formaldehyde derivatives which contain, for example, at least two free N-methylol groups, or alkyl-substituted or acyl-substituted methylol groups. The N-methoxyalkyl derivatives are particularly suitable for use in the radiation-sensitive mixture according to the invention.

The crosslinking agents described above are capable of crosslinking the polymers described below at elevated temperatures under the influence of the photolytically generated acid; they can form a carbonium cation under the conditions described above.

The content of acid-crosslinkable material b) in the radiation-sensitive mixture according to the invention should be about 1 to 50% by weight, preferably about 5 to 25% by weight, in each case based on the total weight of the layer.

The radiation-sensitive mixture according to the invention furthermore contains at least one polymeric water-insoluble binder c) which is, however, soluble or at least swellable in aqueous alkaline solutions. The binder is particularly distinguished in that it readily dissolves the constituents of the radiation-sensitive mixture according to the invention and in particular has the lowest possible intrinsic absorption, that is to say a high transparency, in the wavelength range from about 190 to 300 nm. This does not include, in particular, those binders which are based on novolak condensation resins and have as a rule been employed as photoactive components in combination with naphthoquinone-diazides. Although novolak condensation resins show a reduction in solubility in aqueous-alkaline developers in the non-exposed areas after image-wise exposure, their intrinsic absorption in the wavelength range required for the exposure is undesirably high.

However, the novolak condensation resins mentioned can be employed as a mixture with other resins of relatively high transparency which are suitable as binders. The mixing ratios here depend mainly on the nature of the binder to be mixed with the novolak resin. Its degree of intrinsic absorption in the wavelength range mentioned in particular plays a decisive role, as well as its miscibility with the other constituents of the radiation-sensitive mixture.

Preferably, the binder has an extinction of less than about 0.5 $\mu m^{-1}$ in the wavelength range of the incident radiation. In particular, the binder has an extinction of less than about 0.3 $\mu m^{-1}$ above 240 nm.

In general, the binder of the radiation-sensitive mixture according to the invention can contain up to about 30% by weight, in particular up to about 20% by weight, of a novolak condensation resin, based on the total amount of the binder.

Suitable binders are homo- or copolymers of p-hydroxystyrene and its alkyl derivatives, for example 3-methylhydroxystyrene, as well as homo- or copolymers of other vinylphenols, for example 3-hydroxystyrene, or the esters or amides of acrylic acid with aromatics containing phenolic groups. In a preferred embodiment, the binder contains phenolic hydroxyl groups. Polymerizable compounds, such as styrene, methyl methacrylate, methyl acrylate or similar compounds, can be employed as comonomers in the copolymer.

Mixtures of increased plasma resistance are obtained if vinyl monomers containing silicon, for example vinyltrimethylsilane, are used for the preparation of copolymers of the above type. The transparency of these binders in the range in question is generally higher, so that improved structuring is possible.

Homo- or copolymers of maleimide can be used with the same success. These binders also exhibit a high transparency in the wavelength range described. Styrene, substituted styrenes, vinyl ethers, vinyl esters, vinyl-silyl compounds or (meth) acrylic acid esters are also preferably employed as comonomers here.

Finally, copolymers of styrene with comonomers which effect an increase in solubility in aqueous alkaline solutions can moreover also be used. These include, for example, maleic anhydride, maleic acid half-esters or the like.

The binders mentioned can occur in mixtures if they are miscible and do not impair the optical qualities of the radiation-sensitive mixture. However, binders containing one type of the above-mentioned species are preferred.

The amount of binder is in general about 30 to 95% by weight, in particular about 45 to 90% by weight, preferably about 50 to 85% by weight, based on the total weight of the radiation-sensitive mixture.

It is furthermore possible, if appropriate, for dyestuffs, pigments, plasticizers, wetting agents and flow control agents, and also polyglycols and cellulose ethers, for example ethylcellulose, to be added to the radiation-sensitive mixtures according to the invention to improve specific requirements, such as flexibility, adhesion and gloss.

Preferably, the compound according to formula I used in the radiation-sensitive mixture has the highest molar absorption of all of the constituents of the mixture at 248 nm.

The radiation-sensitive mixture according to the invention is preferably dissolved in solvents, for example ethylene glycol, glycol ether, glycol monomethyl ether, glycol dimethyl ether, glycol monoethyl ether or propylene glycol monoalkyl ethers, in particular propylene glycol methyl ether, aliphatic esters, for example ethyl acetate, hydroxyethyl acetate, alkoxyethyl acetate, n-butyl acetate, propylene glycol monoalkyl ether acetate, in particular propylene glycol methyl ether acetate, or amyl acetate, ethers, for example dioxane, ketones, for example methyl ethyl ketone, methyl isobutyl ketone, cyclopentanone and cyclohexanone, dimethylformamide, dimethylacetamide, hexamethylphosphoric acid amide, N-methyl-pyrrolidone, butyrolactone, tetrahydrofuran and mixtures thereof. Glycol ethers, aliphatic esters and ketones are particularly preferred.

In the end, the choice of solvents depends on the coating process used, the desired layer thickness and the drying conditions. The solvents must likewise be chemically neutral, that is to say they should not react irreversibly with the other components of the layer.

The solutions formed with the constituents of the radiation-sensitive mixture as a rule have a solids content of about 5 to 60% by weight, preferably up to about 50% by weight.

The invention furthermore relates to a radiation-sensitive recording material which essentially consists of a substrate and the radiation-sensitive mixture applied thereto.

Possible substrates are all materials of which or from which capacitors, semiconductors, multi-layered printed circuits or integrated circuits can consist or be produced. Materials which may be mentioned in particular are surfaces of silicon material which has been oxidized by heat and/or coated with aluminum and can optionally also be doped, including all the other substrates customary in semiconductor technology, such as, for example, silicon nitride, gallium arsenide and indium phosphide. The substrates known from liquid crystal display production are furthermore suitable, such as, for example, glass and indium-tin oxide, and moreover metal sheets and foils, for example of aluminum, copper and zinc, and bimetallic and trimetallic foils, and also electrically non-conductive foils on which metals have been vapor-deposited, $SiO_2$ materials optionally coated with aluminum and paper. These substrates can be subjected to heat pretreatment, roughened on the surface, superficially etched or treated with chemicals in order to improve the desired properties, for example to increase the hydrophilicity.

In a particular embodiment, the radiation-sensitive mixture can contain an adhesion promoter for better adhesion in the resist or between the resist and the substrate. In the case of silicon or silicon dioxide substrates, adhesion promoters of the aminosilane type, such as, for example, 3-aminopropyltriethoxysilane or hexamethyldisilazane, are suitable for this purpose.

Examples of carriers which can be used to produce photomechanical recording layers, such as printing forms for letterpress printing, planographic printing and screen printing, and of relief copies are aluminum plates, if appropriate anodically oxidized, grained and/or silicated, zinc plates and steel plates, which have been chromium-plated if appropriate, as well as films of plastic, or paper.

The recording material according to the invention is exposed image-wise. Sources of actinic radiation include: metal halide lamps, carbon arc lamps, xenon lamps and mercuryvapor lamps. The exposure can likewise be carried out with high-energy radiation, such as laser, electron or X-ray radiation. However, lamps which emit light of a wavelength from 190 to 260 nm are particularly preferred, that is to say in particular xenon and/or mercury vapor lamps. Laser light sources, for example Excimer lasers, especially KrF or ArF lasers, which emit at 249 or 193 nm can moreover also be used. The radiation sources must have an adequate emission in the wavelength ranges mentioned.

The layer thickness varies according to its field of use. It is between about 0.1 and 100 μm, in particular between about 1 and 10 μm.

The radiation-sensitive mixture can be applied to the substrate by spraying, flow coating, rolling and whirler and immersion coating. The solvent is then removed by evaporation, so that the radiation-sensitive layer remains on the surface of the substrate. If appropriate, the solvent can be removed by heating the layer to temperatures of up to 150° C. However, it is also possible for the mixture first to be applied to an intermediate carrier in the above-mentioned manner, from where it is transferred onto the final carrier material under pressure and at elevated temperature. Intermediate carriers which can be used are in principle all materials which have also been identified as carrier materials. The layer is then irradiated image-wise. An image pattern is subsequently exposed in the radiation-sensitive layer by developing, by treating the layer with a developer solution which dissolves or removes the non-irradiated areas of the material.

Developers which are used are solutions of reagents such as, for example, silicates, metasilicates, hydroxides, hydrogen phosphates or dihydrogen phosphates and carbonates or bicarbonates of alkali metals and/or alkaline earthmetals, but in particular of ammonium ions, as well as ammonia and the like. Developers which are free from metal ions are described in EP-A 0,023,758, 0,062,733 and 0,097,282 and U.S. Pat. Nos. 4,141,733, 4,628,023 and 4,729,941. The content of these substances in the developer solution is in general 0.1 to 15% by weight, preferably 0.5 to 5% by weight, based on the weight of the developer solution. Developers which are free from metal ions are used in particular. If appropriate, relatively small amounts of a wetting agent can be added to the developers in order to facilitate detachment of the exposed areas in the developer.

The resist structures developed are already astonishingly stable to heat; however, they can be post-hardened if appropriate. This is in general effected by heating the resist structure up to a temperature below the flow temperature on a hot-plate and then exposing the entire surface to UV light from a xenon-mercury vapor lamp (range from 200 to 250 nm). The resist structures are additionally crosslinked by this post-hardening, so that the structures in general have a flow resistance up to temperatures of up to 300° C. The post-hardening can also be carried out without increasing the temperature, by irradiation with high-energy UV light, or merely by-means of a temperature step.

The radiation-sensitive mixture according to the invention is preferably used in lithographic processes for the production of integrated circuits or discrete electrical units. The recording material produced from the mixture serves here as a mask for the subsequent process steps. These include, for example, etching of the layer carrier, implantation of ions into the layer carrier or deposition of metals or other materials onto the layer carrier.

The examples described below are merely a selection of the invention. This is therefore not to be limited to the examples.

The preparation of the α-carbonyl-α-sulfonyl-diazomethanes which are employed according to the invention and are novel in some cases is illustrated with the aid of the preferred phenylsulfonyl-4-bromobenzoyl-diazomethane (PW=parts by weight):

27.8 PW of 4-bromophenacyl bromide and 16.4 PW of sodium benzenesulfinate are suspended in 250 PW of ethanol and the suspension is heated under reflux for 5 hours. The still warm solution is filtered. After cooling, the precipitate formed is filtered off with suction and recrystallized from ethanol. 25.5 PW of almost colorless crystals which prove to be analytically pure phenyl-sulfonyl-(4-bromo-benzoyl)-methane are obtained.

10 PW of the product obtained above are dissolved in 90 PW of acetonitrile, together with 4.8 PW of tosyl azide, and the solution is cooled to 0° C. 2.5 PW of triethylamine are added dropwise to this mixture such that the temperature remains below 10° C. The mixture is subsequently stirred at room temperature for 8 hours and is then freed from the solvent. The residue is taken up in methylene chloride, the mixture is extracted twice with 100 PW of 5% strength aqueous sodium hydroxide solution and the extract is washed neutral and dried. After the solvent has been evaporated off, a solid remains and is recrystallized from ethyl acetate. This gives 7.5 PW of pale yellow crystals of decomposition point 122° C., which prove to be analytically pure phenylsulfonyl-(4-bromobenzoyl)-diazomethane.

Analysis of this compound gave the following values:
calc.: C 46.02%, H 2.47%, N 7.67%, S 8.76%, Br 21.91% found: C 47.1%, H 2.3%, N 7.5%, S 8.4%, Br 22.7%

$^1$H-NMR (CDCl$_3$): 7.4–8.2 ppm (m, 9 H).
$\lambda_{max}$(CHCl$_3$)—242 nm.

The preparation of the α,α-bis-arylsulfonyldiazomethanes which are employed according to the invention and are novel in some cases is illustrated with the aid of the preferred bis-(4-t-butylphenylsulfonyl)-diazomethane (PW=parts by weight):

37.3 PW of 4-t-butylthiophenol are added to 100 PW of sodium hydroxide and the mixture is stirred at room temperature until a clear solution is formed. 18.2 PW of dichloromethane are added to the thiophenol solution. The mixture is heated under reflux for 8 hours. The formaldehyde bis-(4-t-butylphenylmercaptal) formed is taken up in ether and the mixture is washed with 2×200 ml of water. It is then dried over magnesium sulfate and the ether is stripped off. 36 PW of a colorless oil remain.

20 PW of this oil are dissolved in 40 ml of glacial acetic acid and the solution is added dropwise to a mixture, preheated at 90° C. of 200 PW of glacial acetic acid and 60 PW of hydrogen peroxide, the dropping rate being regulated so that the temperature remains below 100° C. When the initially highly exothermic reaction has ended, the mixture is heated at 100° C. for a further 2 hours, cooled and poured into water. 16 PW of bis-(4-t-butylphenylsulfonyl)-methane are obtained by this procedure. The product is recrystallized from ethanol and is obtained with a melting point of 150° to 152° C.

10 PW of the product obtained above are dissolved in 90 PW of acetonitrile together with 4.8 PW of tosyl azide and the mixture is cooled to 0° C. 2.5 PW of triethylamine are added dropwise to this mixture such that the temperature remains below 10° C. The mixture is subsequently stirred at room temperature for 4 hours and is then freed from the solvent. The residue is taken up in methylene chloride, the mixture is extracted twice with 100 PW of 5% strength aqueous sodium hydroxide solution and the extract is washed neutral and dried. After the solvent has been evaporated off, an oil remains and is filtered over a silica gel column using methylene chloride as the solvent. Renewed concentration of the solution gives a solid having a decomposition point of 153° to 155° C., which proves to be analytically pure bis-4-t-butylphenyl-sulfonyldiazomethane.

Analysis of this compound gave the following values:
calculated: C 58.04% H 6.03% N 6.45% S 14.75%
found: C 57.9% H 6.1% N 6.5% S 14.4%

$^1$H-NMR (CDCl$_3$): 1.4 ppm (s, 18 H), 7.4 to 8.2 ppm (q, 8 H)
$\lambda_{max}$(CHCl$_3$)=238, 248 nm.

The other compounds of the general formula I mentioned above can be prepared in an analogous manner.

Examples 1 to 13 demonstrate the suitability of the mixture according to the invention for recording materials in microlithography using radiation of widely varying energy. The superiority of the mixtures according to the invention over the prior art is demonstrated with the aid of Comparison Examples 14 and 15. Examples 16 and 17 document the usability of the mixture in printed circuits and planographic printing plates.

EXAMPLE 1

A coating solution was prepared from
7.5 PW of a cresol-formaldehyde novolak having a softening range from 105° to 120° C.,
2.0 PW of a cresol-formaldehyde resol (Bakelite R5363) and
0.7 PW of phenylsulfonyl-4-methoxybenzoyl-diazomethane in
42 PW of propylene glycol monomethyl ether acetate.

The solution was filtered through a filter of pore diameter 0.2 μm and whirler-coated at 3,000 revolutions per minute onto a wafer treated with an adhesion promoter (hexamethyldisilazane). After drying at 100° C. for 1 minute on a hot-plate, a layer thickness of 1.05 μm was obtained.

The recording material was exposed image-wise under a master to UV radiation from a xenon-mercury vapor lamp at 365 nm at an energy of 60 mJ/cm$^2$. The wafer was then kept at room temperature for 5 minutes and subsequently afterheated on a hot plate at 100° C. for 2 minutes.

The recording material was developed using a 0.3N alkaline developer of the following composition:
5.3 PW of sodium metasilicate×9 H$_2$O,
3.4 PW of trisodium phosphate×12 H$_2$O,
0.3 PW of sodium dihydrogen phosphate and
191 PW of completely desalinated water.

After a development time of 60 seconds, a defect-free negative image of the mask with steep resist flanks was obtained, structures less than 1 μm also being resolved true to detail. Examination of the flanks of the resist profiles by means of scanning electron microscopy showed that these were aligned practically perpendicularly to the substrate surface.

EXAMPLE 2

A coating solution was prepared from
7.5 PW of a copolymer of styrene/p-hydroxystyrene (20/80) having an average molecular weight of 32,000,
2.0 PW of hexamethoxymethylmelamine and
0.7 PW of phenylsulfonyl-toluoyl-diazomethane in
42 PW of propylene glycol monomethyl ether acetate.

The solution was filtered through a filter of pore diameter 0.2 μm and whirler-coated at 3,000 revolutions per minute onto a wafer treated with an adhesion promoter (hexamethyldisilazane). After drying at 100° C. for 1 minute on a hot plate, a layer thickness of 1.12 μm was obtained.

The recording material was exposed image-wise under a master to UV radiation from a xenon-mercury vapor lamp at 260 nm at an energy of 45 mJ/cm$^2$, after-heated at 105° C. for 2 minutes after brief storage and then processed with the developer described in Example 1.

After a development time of 60 seconds, a defect-free image of the mask having a high flank stability was obtained, structures less than 1 μm also being resolved true to detail in this case.

EXAMPLE 3

A wafer produced according to Example 1 was irradiated under a master using UV light of a wavelength of 405 nm at an energy of 85 mJ/cm$^2$. After heating and development, a negative image, true to the original, of the master was obtained.

EXAMPLE 4

The experiment in Example 3 was repeated, but UV light of a wavelength of 436 nm was used. To obtain a negative, sharp-edged image of the master, an exposure energy of 160 mJ/cm$^2$ had to be used.

EXAMPLE 5

A coating solution was prepared from
7.5 PW of a 1:1 copolymer of styrene and maleimide having a softening range from 165° to 180° C.,
2.0 PW of 4,4,-bismethoxymethyldiphenyl ether and
0.7 PW of phenylsulfonyl-(4-chloro-benzoyl)diazomethane in
42 PW of propylene glycol monomethyl ether acetate.

The solution was filtered through a filter of pore diameter 0.2 μm and whirler-coated at 3,700 revolutions per minute onto a wafer treated with an adhesion promoter (hexamethyldisilazane). After drying at 100° C. for 1 minute on a hot plate, a layer thickness of 0.88 μm was obtained.

The recording material was exposed image-wise under a master to UV radiation from a xenon-mercury vapor lamp at 260 nm at an energy of 95 mJ/cm$^2$. The material was kept at room temperature for 5 minutes and then heated at 115° C. for 2 minutes to bring the reaction to completion.

The recording material was developed using a 0.02N aqueous solution of tetramethylammonium hydroxide, the exposed areas being detached without residue within 60 seconds.

A defect-free negative image of the mask with steep resist flanks was again obtained. The removal in the exposed areas was less than 10 nm; structures less than 1 μm were also resolved true to detail.

EXAMPLE 6

A coating solution was prepared from
7.5 PW of a 1:1 copolymer of styrene and maleimide having a softening range from 165° to 180° C.,
2.0 PW of hexa-acetoxymethylmelamine and
0.8 PW of 2-naphthoyl-phenylsulfonyl-diazomethane in
42 PW of propylene glycol monomethyl ether acetate.

The solution was filtered through a filter of pore diameter 0.2 μm and whirler-coated at 3,500 revolutions per minute onto a wafer treated with an adhesion promoter (hexamethyldisilazane). After drying at 100° C. for 1 minute on a hot plate, a layer thickness of 1.00 μm was obtained.

The recording material was exposed image-wise under a master to UV radiation from a xenon-mercury vapor lamp at 260 nm at an energy of 85 mJ/cm$^2$ and heated as described in the example described above.

The recording material was developed using a 0.02N aqueous solution of tetramethylammonium hydroxide, the non-exposed areas being detached without residue within 60 seconds and an image, true to detail, of the master being obtainable. The edge steepness of the image was excellent.

EXAMPLE 7

A coating solution was prepared from
7.5 PW of a cresol-formaldehyde novolak having a softening range from 105° to 120° C.,
2.0 PW of a cresol-formaldehyde resol (Bakelite R5363) and
0.7 PW of bis(4-chlorophenylsulfonyl) diazomethane in
42 PW of propylene glycol monomethyl ether acetate.

The solution was filtered through a filter of pore diameter 0.2 μm and whirler-coated at 3,000 revolutions per minute onto a wafer treated with an adhesion promoter (hexamethyldisilazane). After drying at 100° C. for 1 minute on a hot plate, a layer thickness of 1.04 μm was obtained.

The recording material was exposed image-wise under a master to UV radiation from a xenon-mercury vapor lamp at 365 nm at an energy of 55 mJ/cm$^2$ and subsequently kept at room temperature for 5 minutes and then heated at 130° C. for 90 seconds.

The recording material was developed using the developer described in Example 1.

After a development time of 60 s, a negative, defect-free image of the mask with steep, practically vertical resist flanks was again obtained, structures less than 0.6 μm also being resolved true to detail.

EXAMPLE 8

A coating solution was prepared from
7.5 PW of a copolymer of styrene/p-hydroxystyrene (20/80) having an average molecular weight of 32,000, 2.0 PW of hexamethoxymethylmelamine and
0.7 PW of bis-(4-bromophenylsulfonyl)-diazomethane in
42 PW of propylene glycol monomethyl ether acetate.

The solution was filtered through a filter of pore diameter 0.2 μm and whirler-coated at 3,200 revolutions per minute onto a wafer treated with an adhesion promoter (hexamethyldisilazane). After drying at 100° C. for 1 minute on a hot plate, a layer thickness of 1.3 μm was obtained.

The recording material was exposed image-wise under a master to UV radiation from a xenon-mercury vapor lamp at 260 nm and an energy of 75 mJ/cm$^2$, stored and heated as in the example described above and then processed with the developer described in Example 1.

After a development time of 60 seconds, a negative defect-free image of the mask of high flank stability was obtained, structures less than 0.6 μm also being resolved true to detail here.

EXAMPLE 9

A wafer produced in accordance with Example 8 was irradiated under a master with UV light from a KrF Excimer laser at a wavelength of 248 nm at an energy of 50 mJ/cm$^2$. The wafer was then kept at room temperature for 15 minutes and heated at 140° C. on a hot plate for about 45 seconds. After the development, a negative image, true to the original, of the master in which structures in the submicron range were also reproduced true to detail was obtained in a manner similar to that in Example 8.

EXAMPLE 10

The experiment of Example 7 was repeated, but UV light of a wavelength of 436 nm was used. To obtain a negative sharp-edged image of the master, an exposure energy of 145 mJ/cm$^2$ had to be used.

EXAMPLE 11

A coating solution was prepared from
7.5 PW of a 1:1 copolymer of styrene and maleimide having a softening range from 165° to 180° C.,
2.0 PW of hexa-acetoxymethylmelamine and 0.7 PW of bis-(4-t-butylphenylsulfonyl)-diazomethane in
42 PW of propylene glycol monomethyl ether acetate.

The solution was filtered through a filter of pore diameter 0.2 μm and whirler-coated at 3,300 revolutions per minute onto a wafer treated with an adhesion promoter (hexamethyldisilazane). After drying at 100° C. for 1 minute on a hot plate, a layer thickness of 1.1 μm was obtained.

The recording material was exposed image-wise under a master to UV radiation from a xenon-mercury vapor lamp at 260 nm at an energy of 76 mJ/cm$^2$, kept at room temperature for 5 minutes and then heated at 120° C. for 2 minutes.

The recording material was developed using a 0.02N aqueous solution of tetramethylammonium hydroxide, the non-exposed areas being dissolved without residue within 60 seconds, whilst the exposed areas showed practically no removal at all.

A defect-free negative image of the mask with satisfactorily steep resist flanks was again obtained. According to measurement using a layer thickness measuring instrument from Rudolph, the layer removal from exposed areas was less than 8 nm; structures less than 0.55 μm were also resolved true to detail.

EXAMPLE 12

A coating solution was prepared from
7.5 PW of a 1:1 copolymer of styrene and maleimide having a softening range from 165° to 180° C.,
2.0 PW of 4,4'-bis-methoxymethyldiphenyl sulfone and
0.8 PW of bis-(4-t-butylphenylsulfonyl)-diazomethane in
42 PW of propylene glycol monomethyl ether acetate.

The solution was filtered through a filter of pore diameter 0.2 μm and whirler-coated at 3,500 revolutions per minute onto a wafer treated with an adhesion promoter (hexamethyldisilazane). After drying at 100° C. for 1 minute on a hot plate, a layer thickness of 1.06 μm was obtained.

The recording material was exposed image-wise under a master to UV radiation from a xenon-mercury vapor lamp at 260 nm at an energy of 92 mJ/cm$^2$, and was after-heated in accordance with Example 1.

The recording material was developed using a 0.02N aqueous solution of tetramethylammonium hydroxide, the non-exposed areas being detached without residue within 60 seconds and an image, true to detail, of the master being obtainable. The edge steepness of the image was more than 88°.

EXAMPLE 13

The recording material from Example 11 was irradiated with synchrotron radiation (BESSY, Berlin, 754 MeV) through a gold-on-silicon mask at a dose of 150 mJ/cm$^2$. The experimental set-up is to be found in A. Heuberger, Microelectr. Eng., 3, 535 (1985). The material was kept at room temperature for about 10 minutes and then heated at 110° C. for 2 minutes. After development using the developer described in Example 11 over a development time of 70 seconds, a defect-free negative image of the mask down to structures less than 0.4 μm was obtained. The resist flanks were practically perpendicular to the planar substrate surface.

EXAMPLES 14 AND 15 (COMPARISON EXAMPLES)

The resist formulation of Example 11 was modified by replacing the acid-forming compound used in that example by the same amount of triphenylsulfonium hexafluorophosphate (Example 14) or 2-nitrobenzyl tosylate (Example 15). After exposure to radiation of a wavelength of 260 nm at an energy of 95 and 115 mJ/cm$^2$ respectively, as well as the heating described in that example and development using a developer of the composition described in Example 11, structures which showed no image differentiation suitable for use in practice were obtained.

When the onium salt was used (Example 14), residues of coating were also found in the non-exposed areas, that is to say resist residues stuck to the substrate in the non-exposed areas, while when the tosyl ester was used (Example 15), under-cut resist profiles which, even under intensified exposure, could be eliminated only at the expense of the accuracy of the reproduction were visible.

No acceptable structurings were thus obtainable in either case.

EXAMPLE 16

To produce an offset printing plate, a mechanically roughened and pretreated aluminum foil was whirler-coated with a coating solution of the following composition:

7.5 PW of a cresol-formaldehyde novolak having a softening range from 105° to 120° C.,
2.3 PW of a cresol/formaldehyde resol (Bakelite R 5363),
0.5 PW of bis-(4-chlorophenylsulfonyl)-diazomethane and
0.05 PW of crystal violet base in
90 PW of propylene glycol monomethyl ether acetate.

After the layer had dried (layer weight about 2.5 g/m$^2$), it was exposed under a negative test master for 30 seconds, and after the plate had been kept for 10 minutes, it was heated at a temperature of 140° C. in a circulating air oven for 2 minutes. The plate was developed using a developer of the following composition:

0.5 PW of sodium hydroxide,
0.8 PW of sodium metasilicate×9 H$_2$O and
1.0 PW of 2-n-butoxy-ethanol in
97.7 PW of completely desalinated water.

On development, an inverse reproduction, true to detail, of the master became visible. After rinsing with water, the plate was rendered ready for printing by wiping over with 1% strength phosphoric acid. After being clamped in a printing machine, 175,000 perfect prints of the master were obtained.

EXAMPLE 17

A solution of an etch and galvanonegative dry resist was prepared by preparing the following composition:
12.5 PW of the novolak described in Example 16,
10.0 PW of hexamethoxymethylmelamine,
0.5 PW of bis-(4-methylphenylsulfonyl)-diazomethane and
0.1 PW of crystal violet in
30 PW of butanone.

A polyethylene terephthalate film 25 μm thick customary for this purpose was coated with this solution so that a dry layer thickness of 18 μm resulted. The surface of the dry resist film was laminated with a further polyethylene terephthalate film. After the covering film had been peeled off, the dry film was laminated onto a brass sheet under pressure and heat. After cooling and peeling off the carrier film, the sheet was exposed through a master, a good image contrast becoming visible. The material was kept for 10 minutes and then heated at 95° C. for 4 minutes. The non-exposed areas were subjected to spray development using a developer of the composition described in Example 16. The sheet was then etched with commercially available ferrichloride solution until the flanks which were too smooth were etched through. The resulting moldings can be worked still further before separating.

What is claimed is:

1. A negative-working radiation-sensitive mixture comprising in admixture, in amounts sufficient to produce a negative-working radiation-sensitive mixture
   (a) 0.5 to 10% by weight of a compound which forms an acid under irradiation,
   (b) a compound containing at least two reactive groups which can be crosslinked by an acid selected from at least one of resols, alkoxymethyl- or glycidyl substituted aromatics, monomeric or oligomeric melamine- or urea-formaldehyde condensates, melamine/formaldehyde derivatives containing at least two N-hydroxymethyl, alkoxymethyl or acyloxymethyl groups, and aromatics and heterocyclic compounds polysubstituted with hydroxymethyl, acetoxymethyl, and methoxymethyl, and
   (c) a water-insoluble binder which is soluble or at least swellable in aqueous-alkaline solutions,
wherein the compound (a) is a compound of the formula I

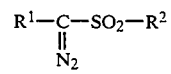

in which
R$^1$ is one of the radicals R$^2$—SO$_2$— or R$^3$—C(O)— and
R$^2$ and R$^3$ are independently an alkyl, cycloalkyl, aryl or heteroaryl radical.

2. A negative-working radiation-sensitive mixture as claimed in claim 1, wherein the radicals R$^2$ and R$^3$ of said compound of the formula I are independently selected from (C$_1$ to C$_6$) alkyl, (C$_5$–C$_{12}$) cycloalkyl, (C$_6$–C$_{12}$) aryl, or a mono- or dinuclear heteroalkyl radical having five or six members containing an O, S, or N heteroatom.

3. A negative-working radiation-sensitive mixture as claimed in claim 1, wherein at least one of the radicals R$^2$ and R$^3$ of said compound of the formula I is an alkyl radical having 1 to 6 carbon atoms or an aryl radical.

4. A negative-working radiation-sensitive mixture as claimed in claim 3, wherein at least one of the radicals R$^2$ and R$^3$ of said compound of the formula I is an aryl radical.

5. A negative-working radiation-sensitive mixture as claimed in claim 4, wherein the aryl radicals R$^2$ and R$^3$ contain substituents chosen from the group consisting of alkyl, alkoxy, alkoxyalkyl and cyano radicals and halogen atoms.

6. A negative-working radiation-sensitive mixture as claimed in claim 1, comprising about 30 to 95% by weight of said binder, based on the total weight of the radiation-sensitive mixture.

7. A negative-working radiation-sensitive mixture as claimed in claim 6, comprising about 45 to 90% by weight of said binder, based on the total weight of the radiation-sensitive mixture.

8. A negative-working radiation-sensitive mixture as claimed in claim 1, wherein said binder has an extinction of less than about 0.5 μm$^{-1}$ in the wavelength range of the incident radiation.

9. A negative-working radiation-sensitive mixture as claimed in claim 8, wherein said binder has an extinction of less than about 0.3 μm$^{-1}$ above 240 nm.

10. A negative-working radiation-sensitive mixture as claimed in claim 1, wherein said binder comprises up to about 30% by weight of a novolak condensation resin, based on the total amount of the binder.

11. A negative-working radiation-sensitive mixture as claimed in claim 10, wherein said binder comprises up to about 20% by weight of a novolak condensation resin, based on the total amount of the binder.

12. A negative-working radiation-sensitive mixture as claimed in claim 1, wherein said binder comprises phenolic hydroxyl groups.

13. A negative-working radiation-sensitive mixture as claimed in claim 1, in which the crosslinkable compound is a resol.

14. A negative-working radiation-sensitive mixture as claimed in claim 1, in which the crosslinkable compound is an alkoxymethyl- or glycidyl-substituted aromatic.

15. A negative-working radiation-sensitive mixture as claimed in claim 1, in which the crosslinkable compound is a melamine/formaldehyde condensate or urea/formaldehyde condensate.

16. A negative-working radiation-sensitive mixture as claimed in claim 1, comprising about 1 to 50% by weight of said crosslinkable compound.

17. A negative-working radiation-sensitive mixture as claimed in claim 1, in which said compound of the formula I has the highest molar absorption of all of the constituents of said mixture at 248 nm.

18. A negative-working radiation-sensitive mixture as claimed in claim 1, consisting essentially of the recited ingredients.

19. A negative-working radiation-sensitive mixture as claimed in claim 1, wherein $R^1$ is $R^2SO_2-$.

20. A negative-working radiation-sensitive mixture as claimed in claim 1, wherein $R^1$ is $R^3C(O)-$.

21. A negative-working radiation-sensitive mixture as claimed in claim 1, containing about 1 to 10% by weight of compound I, about 5 to 25% by weight of (b), and about 50 to 90% by weight of (c), each percent based on the total weight of the radiation-sensitive mixture.

22. A negative-working radiation-sensitive mixture as claimed in claim 1, wherein said crosslinkable compound comprises a compound of the formula:

$$(R^4O-CHR^6)_n-A-(CHR^6-OR^5)_m \quad (II)$$

in which
A is $-B-$ or $-B-Y-B-$,
B is a mononuclear aromatic hydrocarbon or a heterocyclic aromatic compound containing oxygen or sulfur,
Y is a single bond, $(C_1-C_4)$alkylene or $(C_1-C_4)$alkylenedioxy, the chains of which can be interrupted by oxygen atoms, $-O-$, $-S-$, $-SO_2-$, $-CO-$, $-CO_2-$, $-O-CO_2-$, $-CONH-$ or phenylenedioxy,
$R^4$ and $R^5$ are hydrogen, $(C_1-C_6)$alkyl, $C_5-$ or $C_6-$cycloalkyl, $(C_6-C_{12})$aryl, $(C_1-C_{12})$-aralkyl or acyl,
$R^6$ is hydrogen, $(C_1-C_4)$alkyl or phenyl,
n is an integer from 1 to 3 and
m is an integer from 0 to 3, $n+m$ being at least 2.

23. A negative-working radiation-sensitive mixture as claimed in claim 1, wherein said binder is selected from the group consisting of a styrene/p-hydroxy styrene copolymer, a styrene/maleimide copolymer, and a cresol-formaldehyde novolak.

24. A negative-working radiation-sensitive recording material comprising a substrate and a radiation-sensitive layer, wherein the layer comprises a mixture as claimed in claim 1.

25. A negative-working radiation-sensitive recording material as claimed in claim 24, wherein said radiation-sensitive mixture further comprises an adhesion promoter.

26. A negative-working radiation-sensitive recording material as claimed in claim 24, consisting essentially of the recited ingredients.

* * * * *